United States Patent
Miettinen

(10) Patent No.: US 7,652,602 B2
(45) Date of Patent: Jan. 26, 2010

(54) SIGNAL INTERFACE CIRCUIT

(75) Inventor: Erkki Miettinen, Kokemäki (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 12/068,657

(22) Filed: Feb. 8, 2008

(65) Prior Publication Data

US 2008/0204289 A1 Aug. 28, 2008

(30) Foreign Application Priority Data

Feb. 12, 2007 (FI) .................................. 20070122

(51) Int. Cl.
*H03M 1/00* (2006.01)

(52) U.S. Cl. ...................... 341/141; 341/110; 341/117; 341/116; 341/143

(58) Field of Classification Search ......... 341/110–117, 341/141, 142, 143
See application file for complete search history.

(56) References Cited

U.S. PATENT DOCUMENTS

| 4,316,132 | A | | 2/1982 | Geppert | |
|---|---|---|---|---|---|
| 5,248,971 | A | * | 9/1993 | Mandl | ..................... 341/141 |
| 5,349,351 | A | | 9/1994 | Obara et al. | |
| 5,422,643 | A | | 6/1995 | Chu et al. | |
| 5,506,777 | A | | 4/1996 | Skrbina et al. | |
| 5,617,090 | A | * | 4/1997 | Ma et al. | ..................... 341/141 |
| 5,627,536 | A | * | 5/1997 | Ramirez | ..................... 341/141 |
| 5,805,094 | A | * | 9/1998 | Roach et al. | ................. 341/144 |
| 6,587,062 | B1 | * | 7/2003 | Reinhold et al. | ............ 341/143 |
| 6,657,574 | B1 | * | 12/2003 | Rhode | ......................... 341/155 |
| 6,683,548 | B2 | * | 1/2004 | Scott et al. | .................. 341/110 |
| 6,762,708 | B1 | * | 7/2004 | Sutardja | ..................... 341/155 |
| 6,879,274 | B2 | * | 4/2005 | Nestler et al. | ............... 341/118 |
| 7,012,399 | B2 | * | 3/2006 | Suzuki | ........................ 318/661 |
| 7,126,514 | B2 | | 10/2006 | Kohara | |
| 7,142,606 | B2 | * | 11/2006 | Talwalkar et al. | ........... 375/259 |
| 7,288,940 | B2 | * | 10/2007 | Wynne et al. | ............... 324/415 |
| 7,330,544 | B2 | * | 2/2008 | D'Angelo et al. | ...... 379/399.01 |
| 2007/0157720 | A1 | * | 7/2007 | Veerasamy | ............... 73/170.17 |

OTHER PUBLICATIONS

Finnish Office Action dated Dec. 21, 2007.

* cited by examiner

*Primary Examiner*—Linh V Nguyen
(74) *Attorney, Agent, or Firm*—Buchanan Ingersoll & Rooney PC

(57) ABSTRACT

Interface unit for voltage input signals comprising two or more input channels. The input signals of these two or more input channels are connected alternately by an analog multiplexer to an analog-to-digital converter. The A/D converter comprises an integrated sigma-delta modulator circuit which generates a digitized 1-bit signal representing the input signal voltage level for a control unit irrespective of whether the input channel signal is digital or analog. By means of the invention all input voltage channels are made similar such that the input channels of the interface unit can receive an analog or digital signal irrespective of each other.

14 Claims, 1 Drawing Sheet

SIGNAL INTERFACE CIRCUIT

BACKGROUND OF THE INVENTION

The invention relates to a signal interface for a voltage input signal.

In industrial instrumentation, industrial electric drives, such as motor drives and frequency converters, and also in other drives there is often a need for analog or digital signals that signal various quantities relating to the operation of the drive. Such signals may include, for example, control signals and measurement signals. Signal sources may include a rotatory switch or a push button, a guard switch, sensors etc. The voltage level and voltage type depend on the signal source but vary typically from DC voltage of 0 to 10 VDC to alternating voltage (AC) of 230 VAC of different switch signals.

Conventionally, analog and digital signals have been separated by forming them already on the hardware level as separate groups of input channels in such a way that the analog channels are converted into digital form with multiple-input SAR (Successive Approximation Register) type A/D converters, and digital inputs typically utilize optoisolators to provide galvanic isolation from the common potential of the channels. To improve resolution, the measurement range of the analog inputs is typically dimensioned to ten volts, whereby special measures have had to be used for analog voltages higher than this. Correspondingly, digital channels have typically been intended for one single nominal voltage level, i.e. either for a DC level of 24 volts or in special cases for an AC level of 230 volts.

In digitizing, a converter of the SAR type has, however, several disadvantages, a few of which are presented in the following. 1) Even a short interference peak affecting an analog signal to be measured at the sampling moment may lead to a greatly erroneous digitized value because the sampling may last only a few nanoseconds. 2) To prevent interference the measuring circuit must be provided with hardware filters, and on the digital signal processing side, digital filters and discriminators of different levels must still be arranged. 3) Conventionally, the analog signals to be digitized are bound to the same ground potential, whereby loop currents are easily generated and may cause mains-frequency common-mode interference that is difficult to prevent. 4) Fast SAR converters capable of over 12-bit conversion are expensive, so the input channels must be adapted for operation in a given limited voltage range in order for the resolution of the digitization to be sufficient. 5) Hardware filtering provided due to interference usually prevents measurement of digital input signals by means of a high-speed SAR converter.

U.S. Pat. No. 4,316,132, U.S. Pat. No. 5,349,351 and U.S. Pat. No. 7,126,514 disclose multiplexing of analog control signals to one or more A/D converters.

For digital input signals, in turn, the galvanic isolation has conventionally been provided by using optoisolators, which enable safe detection of even 230-volt voltage levels. Optoisolators have, however, several disadvatages, a few of which are presented in the following: 1) the relatively high current level required by LED on the input side (5 . . . 10 mA), which results in either very limited input voltage ranges or in a complex and expensive constant-current generator; 2) this results in loading of a signal source, which is not always acceptable; 3) a great power loss at a high input voltage; and 4) a need for separate rectification when alternating voltages are indicated, and also for a comparator if it is desirable to transfer polarity information.

To keep the costs at a reasonable level, the input channels have typically been positioned, according to standard procedure, as part of a particular motor control board, which is often positioned close to the power stage of the frequency converter or even constructed as part of it. This involves several disadvantages.

BRIEF DESCRIPTION OF THE INVENTION

It is an object of the invention to provide a signal interface circuit of a new type. The object of the invention is achieved with a signal interface unit and an electric motor drive that are characterized by what is stated in the independent claims. Preferred embodiments of the invention are described in the dependent claims.

The interface unit for voltage input signals comprises two or more input channels, to each of which a digital or analog input signal can be connected irrespective of other input channels. The input signals of these two or more input channels are connected alternately by an analog multiplexer to an analog-to-digital (A/D) converter. The A/D converter comprises an integrated sigma-delta modulator circuit which generates a digitized 1-bit signal representing the input signal voltage level to be interpreted by a control unit irrespective of whether the input channel signal is a digital or analog signal. By means of the invention all input voltage channels are made similar irrespective of whether the signals are analog or digital. The input channels of the interface unit according to the invention may receive an analog or digital signal irrespective of each other, in other words the same interface unit structure may receive a desired number of both analog and digital input signals, only analog input signals or only digital input signals. The invention makes it possible to avoid the need for different units for digital and analog signals as well as the need for two units if both digital and analog signals are to be processed. This results in cost savings in both manufacturing and installing. Further, an input signal may be flexibly converted from a digital signal to an analog one or vice versa during the use. The nominal measurement range of the input channels can be selected freely, for example by changing the values of the voltage divider resistors at the inputs, so the measurement range of mains-voltage level signals, for example, may be ±500 volts, whereas the input voltage range of a channel intended for measuring a setpoint value may be selected to be for example ±12 volts, if desired.

In accordance with an embodiment of the invention, the integrated galvanic isolation is integrated into a sigma-delta modulator circuit between the analog input and the digital output. Further, the interface unit may be provided with an integrated, galvanically isolating circuit having at least one control signal input from a control unit and at least one control signal output which has a galvanic isolation from the control signal input and provides either directly or indirectly a control signal for the analog multiplexer. In this way, the common potential level of the galvanically isolated input signal groups is freely selectable, whereby interference-generating ground currents or other loop currents are not generated. In an embodiment of the invention, this integrated, galvanically isolating circuit comprises a DC-DC converter circuit having at least one control signal input from the control unit, and an operating voltage input, as well as at least one control signal output and an operating voltage output which are galvanically isolated from the inputs, whereby said control signal output provides said control signal directly or indirectly, and said operating voltage output generates an operating voltage for the analog multiplexer and the analog side of the sigma-delta modulator circuit. Owing to this galvanically isolated operating voltage, no separate auxiliary voltage supply is needed, which reduces the manufacturing costs and improves galvanic isolation.

Electric motor drives are a particular application area of the invention. In an electric motor drive, the interface unit according to the invention is preferably positioned on a separate circuit board, which is installed in a board connector on the main circuit board of the motor drive, and the control unit receiving a digitized output signal and generating control of the multiplexer is positioned on the main circuit board. This also includes an embodiment in which the interface unit is connected with a (serial communication) cable to the motor control board, on which the control unit is positioned. By means of these solutions, structural problems related to conventional I/O connections can be decreased.

BRIEF DESCRIPTION OF THE DRAWINGS

The invention will now be described in more detail in connection with exemplary embodiments, referring to the attached drawing, in which.

DETAILED DESCRIPTION OF EXEMPLARY EMBODIMENTS OF THE INVENTION

Figure 1:
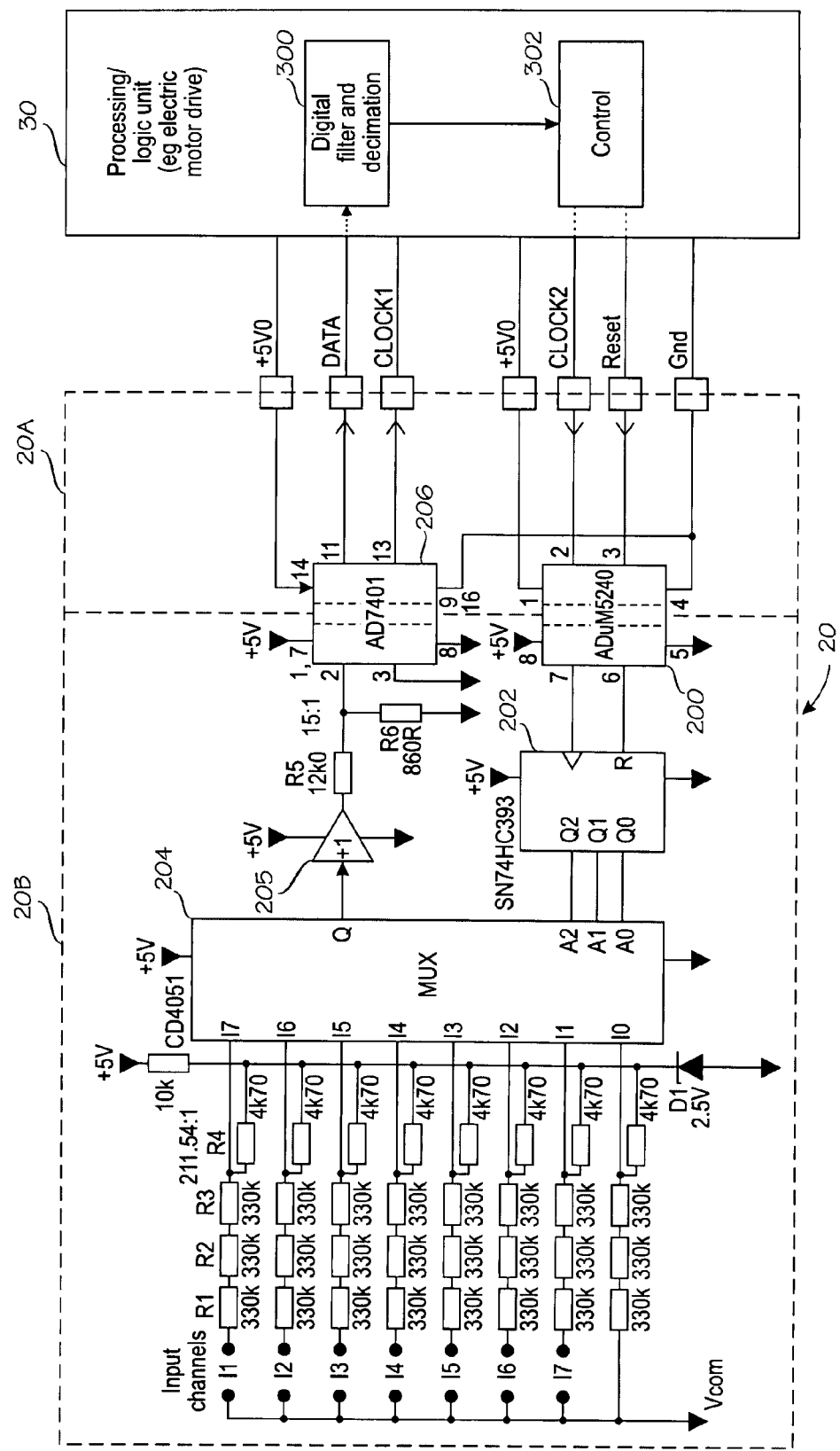
FIG. 1 shows a circuit diagram of an exemplary circuitry applying the principles of the present invention.

In the example shown in FIG. 1, the invention is implemented with two separate modules (e.g. circuit boards) 20 and 30, but the invention may be implemented as one or more modules as well.

The example circuitry of FIG. 1 has seven input channels $I_1$-$I_7$, each of which is connected to the corresponding input terminals (17)-(11) of the analog multiplexer 204 via voltage dividers formed by resistors R1, R2, R3 and R4. It is to be noted, however, that the number N of input channels may be any N≧2. The number of input channels in the measurement may be increased from the seven channels shown in FIG. 1 by means of a multiplexer circuit of a different type or by using several multiplexer circuits. The example circuitry utilizes a multiplexing circuit CD4051 manufactured by National Semiconductors Inc, for example, but also various analog multiplexers implemented with the CMOS technology are available with power consumption which is typically only in the range of microwatts. The common "zero" potential level $V_{com}$ of the input channels provides a galvanically isolated, floating measurement potential level that can be set freely, whereby no interference-generating ground or other loop currents are generated. The resistive voltage divider R1-R2-R3-R4 attenuates the input voltages of the channels $I_1$-$I_7$. The nominal measurement range of the input channels may be selected freely by changing the resistor values in the voltage divider R1-R2-R3-R4, so that measurement range of mains-voltage level signals may be ±500 volts, whereas the input voltage range of a channel intended for measuring a setpoint value may be selected to be ±12 volts, for example. Since the multiplexer CD4051 cannot deliver negative voltage levels, a level shifting voltage of +2.5 volts has been selected to serve as a common point to the input channels in the exemplary circuitry. This level shifting voltage may be achieved with a zener diode D1 or a corresponding reference circuit. Owing to voltage division and level shifting, even all negative input voltages are delivered as positive signals to the output of the multiplexer 204 and further to be digitized.

The input terminals 10 to 17 of the multiplexer 204 are selected to be active and connected alternately to an output Q by providing the desired binary information to the address inputs A0 to A2, for example from a binary counter 202, which is, in turn, clocked and reset via a digital isolator 200 from a control module 30 controlling the whole of the measurement, for instance with a microprocessor.

Since the resistance of the CMOS switches of the multiplexer 204 is in the exemplary circuitry relatively high and the resistance value varies from one switch to another, the analog signal obtained from the Q output of the multiplexer 204 may not be applied as such to the voltage divider formed by resistors R5 (12 kΩ) and R6 (860Ω), but a separate buffer amplifier 205 may be used as an impedance converter with unity nominal voltage amplification. The buffer amplifier may be implemented with a suitable integrated operational amplifier, for instance.

In the example of FIG. 1, the digitizing is performed by a $\Sigma/\Delta$ modulator having excellent absolute accuracy and stability while still being inexpensive. Owing to its principle of operation, the $\Sigma/\Delta$ modulator is also particularly resistant to different interference peaks. In the preferred embodiment of the invention shown in FIG. 1, a measuring and digitizing unit 206 is implemented with an integrated $\Sigma/\Delta$ modulator circuit AD7401 manufactured by Analog Devices. AD7401 is a second-order $\Sigma/\Delta$ modulator, which converts an analog input signal into a high-rate 1-bit data stream and further comprises digital isolation implemented within an integrated circuit chip. This isolation is illustrated with a broken line within the unit 206 in FIG. 1. Owing to this, the measuring and digitizing unit 206 also functions as a galvanically isolating interface between the analog part 20B and the digital part 20A of the module 20. Alternatively, if for instance an AD converter with no internal galvanic isolation is used as the measuring and digitizing unit 206, galvanic isolation may be implemented with a separate isolator circuit, such as AduM5240 used as the isolator circuit 200. The analog modulator of the integrated circuit AD7401 continuously samples a node 28 in the voltage divider R5-R6, whereby no external sample and hold circuitry is needed. In connection with some AD converter circuits, however, an external sample and hold circuit or another corresponding measuring circuit may be required. In order to function correctly, the $\Sigma/\Delta$ modulator AD7401 needs a clock signal Clock1 of 20 MHz at the most, whereby a one-bit data stream DATA whose pulse width has been modulated in one way is supplied, in phase with the clock signal Clock 1, to the control module 30, where it can be subjected to digital filtering and decimation 300 to produce multibit measuring information. A Sinc$^3$ filter, for example, is preferable because it is one order higher than the second-order modulator AD7401. If, in addition, a decimation ratio 256 is used, the result is a 16-bit word at a rate of 62.5 kHz when the external clock signal Clock1 fed to the unit 206 is 16 MHz. When 1 bit is used for the sign, a resolution of ±15 bits is obtained. The digital filtering and modulation 300 may be implemented with an integrated circuit or a signal processor. In the example of FIG. 1, digital filtering and decimation are positioned in a different processing/logic unit 30, such as in an electric motor drive, because this arrangement provides several advantages. The module generating an analog output signal may be implemented in smaller size. Fewer signal wires are needed between the module 20 and the processing/logic unit because the measuring data is transferred as 1-bit data. The digital filtering and decimation 300 may, if desired, be implemented by way of program in the processor of the processing/logic unit 30.

The control signals of the module 30, i.e. a clock signal Clock2 and a reset signal Reset, are connected to a dual-channel digital isolator 200 that isolates the digital I/O part 20A of the module 20 from the floating part 20B. In the exemplary embodiment, the digital isolator 200 is implemented with an integrated circuit comprising an integrated DC/DC converter, such as AduM5240 manufactured by Analog Devices Inc. The digital isolator's 200, such as AduM5240's, own internal, galvanically isolating current source preferably generates auxiliary power required in galvanically isolated and floating measuring potential for all other components of the floating module part 20B, whereby no separate auxiliary voltage source is required. In the example of FIG. 1, the total current consumption of the circuits 200, 202, 204, 205 and 206 on the side of the measuring potential is about 10 milliamperes, which the circuit AduM5240 is capable of generating as its nominal output level.

The operating voltage +5V and zero potential (ground) Gnd of the input side of the digital isolator 200, which is positioned in the non-floating module part 20A, are preferably supplied from the module 30. Correspondingly, also the operating voltage +5V and zero potential (ground) Gnd of the digital side of the sigma-delta modulator 206 are preferably supplied from the module 30.

The total costs of the components in the measuring circuit according to the embodiment shown are minimized but the input voltages are still measured as accurately as possible with a sigma-delta modulator capable of 16-bit resolution.

The whole measuring process is typically controlled from a control unit 302, such as a microprocessor, which may be positioned on a separate module 30, for example in connection with an electric drive. The measurements are preferably carried out at a speed selected by programming, whereby the measuring result of the analog signals may, if required, be averaged out to minimize the effect of interference and incidental errors. Correspondingly, measurement of accurate signal amplitude is not the intention with digital-type inputs but what is important is the moment of time when a change in the state information takes place.

With analog inputs, 16-bit resolution easily results in a speed at which each of the seven input channels are measured for instance a thousand times a second. If the channels are allocated to be digital, the speed may be tenfolded by reducing the resolution to 10 bits, for example. Having one channel, the circuitry is capable of detecting a change in the state information, for example, within a few microseconds, which is sufficient for most of the digital signals.

Next, let us consider the measuring process. The measuring cycle is started every time by giving a reset pulse from the control unit 302 along a Reset line. A reset pulse is transferred through the digital isolator 200 to the input terminal R of the binary counter 202, whereby the output of the counter is reset to the zero state. Thus, the multiplexer 204 selects the input channel I0, in other words the measuring cycle is started by measuring a level shifting voltage of +2.500 volts via the input I0 of the multiplexer. At terminal I0 there prevails 2.500 V−((2.500 V/994700Ω)*4700Ω)=2.500 V−0.0118 V=2.4882 V, which appears at the input terminal 28 of the Σ/Δ modulator 206 as $\frac{1}{15}$, i.e. 0.1659 volts.

The control 302 further supplies the clock signal Clock2 via the digital isolator 200 to the clock input terminal of the binary counter 202, whereby the output value Q2Q1Q0 of the binary counter 202 increases in synchronism with the clock signal, selecting alternately one of the inputs 11 to 17 and one of the outputs $I_1$-$I_7$ for measurement.

If it is assumed that the highest negative input voltage of a given input channel $I_1$-$I_7$ is −500 V, the overall voltage of −502.5 volts affects over the input voltage divider R1-R2-R3-R4, of which voltage −2.374 volts remains over the resistor R4. The voltage of the corresponding input channel 11-17 of the multiplexer 204 is thus 2.500 V+(−2.374 V)=0.1257 V. If the highest positive input voltage of a given input channel $I_1$-$I_7$ is +500 V, the voltage of the corresponding input channel 11-17 of the multiplexer 204 is 4.8510 V. When these voltages are further attenuated to $\frac{1}{15}$, voltages of 0.0084 V and 0.3234 V appear at the input terminal 28 of the Σ/Δ modulator 206. From these values, the voltage measured by the level-shifting channel is yet to be subtracted, so that the final measuring results are 0.0084 V−0.1659 V=−0.1575 V, and 0.3234 V−0.1659 V=+0.1575 V. The values are naturally equal but opposite in sign. When the overall attenuation of the voltage dividers is 211.64*15=3164.6, it is easy to perform multiplication 3164.6*0.1575 V=500 V for a check. When a voltage of +500 volts is measured, the input range of the Σ/Δ modulator is slightly exceeded, so the real measuring range in the positive direction is 0.3200 V/0.3234 V*500 V=494.7 V.

The present invention is not intended to be limited to the above components, component values or circuit solutions but it is obvious that by changing component values, components and circuit solutions, properties of the device may be changed without deviating from the basic principles of the present invention.

In an embodiment of the invention, the module 20 of FIG. 1 is implemented as a small circuit board module that may comprise a desired number of input channels. The circuit board 20 of the module is provided with a suitable connector, with which the module circuit board 20 may be positioned in the corresponding connector on the motherboard. Preferably, the motherboard also comprises the functions of the module 30. With this structure, several advantages are achieved compared with conventional solutions, in which the input channels with their connectors are typically positioned for example as part of a frequency converter's motor control board, which is often positioned close to the power stage of the frequency converter or which is even constructed as part of it. This has resulted in numerous disadvantages. Due to its complexity, the frequency converter board, such as a motor control board, has usually at least six layers, whereby positioning simple I/O functions on the mother board means wasting expensive area. If the input channels were made directly to the motor control board at the installing stage, there would be, due to the bending caused by mechanical forces in the installing, a risk of the numerous and partly large-size surface-mounting components being damaged, which would not be revealed until at the start-up stage. Maintenance is expensive and may cause delays. A natural route must be reserved for all I/O cables, which is often very difficult due to the narrow space available for the frequency converter board or motor control board and leads to solutions where maintenance measures are substantially complicated, and not even the level of electromagnetic interference (EMC) achieved is sufficient. Further, it is often preferable, for cabling, connecting and maintenance purposes, to position the I/O interfaces of several drive groups centrally in one single place completely separately from the motor control, but it cannot be done because the I/O functions are positioned directly on the motherboard. By means of the module board 20 according to a preferred embodiment of the invention, which is positioned with a connector on the motherboard on the motor control board of a motor drive or connected with a serial-communication cable to the motor control board, on which the control unit is positioned, above prior art problems can be avoided and desired advantages described above can be achieved.

It will be obvious to a person skilled in the art that as the technology advances, the basic idea of the invention may be implemented in a plurality of ways. The invention and its embodiments are thus not limited to the above examples but may vary within the scope of the claims.

The invention claimed is:

1. An interface unit for voltage input signals, comprising:
   an analog-digital converter for converting an input signal voltage into a digital output signal for a control unit, the input signal voltage being galvanically isolated from the digital output signal;
   two or more input channels; and
   an analog multiplexer configured to switch the input signal of said two or more input channels alternately to said analog-digital converter;
   wherein each input channel is configurable to receive a digital input signal instead of an analog input signal while one or more of other input channels is configured to receive an analog input signal; and
   wherein said analog-digital converter comprises an integrated sigma-delta modulator configured to generate a digitized 1-bit signal representing both a voltage level of the digital input signal or signals and the analog input signal or signals for interpretation of the control unit.

2. An interface unit according to claim 1, comprising by galvanic isolation integrated into said sigma-delta modulator circuit between the analog input and the digital output;
   an integrated galvanic isolating circuit having at least one control signal input from said control unit and at least one control signal output isolated galvanically from the control signal input, which control signal output provides either directly or indirectly a control signal for the analog multiplexer.

3. An interface unit according to claim 2, wherein said integrated galvanically isolating circuit comprises a DC-DC converter circuit having at least one control signal input from the control unit, and an operating voltage input, as well as at least one control signal output and operating signal output galvanically isolated from the inputs, whereby said control signal output provides directly or indirectly said control signal, and said operating voltage output provides an operating voltage for the analog multiplexer and for the analog side of the sigma-delta modulator circuit.

4. An interface unit according to claim 2, comprising a binary counter configured to generate, clocked by said control signal output, a cyclic binary number sequence to serve as the control signal of the analog multiplexer.

5. An interface unit according to claim 1, comprising digital means for filtering and decimating a digitized 1-bit signal generated by the sigma-delta modulator, so that a multi-bit, digitized, actual current or voltage value is obtained for the control unit.

6. An interface unit for voltage input signals, comprising:
   an analog-digital converter for converting an input signal voltage into a digital output signal for a control unit;
   two or more input channels; and
   an analog multiplexer configured to switch the input signal of said two or more input channels alternately to said analog-digital converter, wherein one input channel of the analog multiplexer is connected to a constant voltage for calibration of the interface units;
   wherein each input channel is configurable to receive a digital or analog input signal irrespective of other input channels; and
   wherein said analog-digital converter comprises an integrated sigma-delta modulator configured to generate a digitized 1-bit signal representing a voltage level of the input signal for interpretation of the control unit irrespective of whether the signal of the input channel is digital or analog.

7. An electric motor drive comprising an interface unit, said interface unit comprising:
   an analog-digital converter for converting an input signal voltage into a digital output signal for a control unit, the input signal voltage being galvanically isolated from the digital output signal;
   two or more input channels; and
   an analog multiplexer configured to switch the signal of said two or more input channels alternately to said analog-digital converter;
   wherein each input channel is configurable to receive a digital input signal instead of an analog input signal while one or more of other input channels is configured to receive an analog input signal; and
   wherein said analog-digital converter comprises an integrated sigma-delta modulator configured to generate a digitized 1-bit signal representing both a voltage level of the digital input signal or signal and the analog input signal or signals for interpretation of the control unit.

8. An electric motor drive according to claim 7, wherein said control unit comprises a control processor or logic of the electric motor drive.

9. An electric motor drive according to claim 7, wherein the interface unit is positioned on a separate circuit board, which is connected with a serial-communication cable to a motor control board of the motor drive or installed in a board connector on the motor control board of the motor drive, and wherein the control unit is positioned on the motor control board.

10. An electric motor drive according to claim 7, comprising:
    an integrated galvanic isolating circuit integrated into said sigma-delta modulator between the analog input and the digital output, the integrated galvanic isolating circuit having at least one control signal input from said control unit and at least one control signal output isolated galvanically from the control signal input, which control signal output provides a control signal for the analog multiplexer.

11. An electric motor drive according to claim 10, wherein said integrated galvanic isolating circuit comprises:
    a DC-DC converter circuit having at least one control signal input from the control unit;
    an operating voltage input; and
    at least one control signal output and operating signal output galvanically isolated from the control signal and operating voltage inputs, wherein said control signal output provides directly or indirectly said control signal, and said operating voltage output provides an operating voltage for the analog multiplexer and for the analog side of the sigma-delta modulator circuit.

12. An electric motor drive according to claim 10, comprising:
    a binary counter configured to generate, clocked by said control signal output, a cyclic binary number sequence to serve as the control signal of the analog multiplexer.

13. An electric motor drive according to claim 7, comprising:
    digital means for filtering and decimating a digitized 1-bit signal generated by the sigma-delta modulator, to provide a multi-bit, digitized, actual current or voltage value for the control unit.

14. An interface unit according to claim 7, wherein an input channel of the analog multiplexer is connected to a constant voltage for calibration of the interface unit.

* * * * *